United States Patent [19]

Reed

[11] Patent Number: 5,306,078
[45] Date of Patent: Apr. 26, 1994

[54] MOTOR VEHICLE RADIO RECEIVING CABINET

[76] Inventor: Russell E. Reed, 1212 Duffy Pl., Raleigh, N.C. 27603

[21] Appl. No.: 948,104

[22] Filed: Sep. 21, 1992

[51] Int. Cl.$^5$ .......................... A47B 5/00; A47B 81/06
[52] U.S. Cl. .......................................... 312/7.1; 211/40
[58] Field of Search .............................. 312/7.1–7.2, 312/8.12, 8.16, 223, 351; 381/150; 211/26–27, 40

[56] References Cited

U.S. PATENT DOCUMENTS

| | | | |
|---|---|---|---|
| 3,572,873 | 3/1971 | Harting | 312/7.1 X |
| 3,926,487 | 12/1975 | Reyes | 312/7.1 X |
| 4,870,630 | 9/1989 | Blake | 312/7.1 X |
| 4,870,702 | 9/1989 | Azzouni | 312/7.1 X |
| 5,001,779 | 3/1991 | Eggert et al. | 312/7.1 X |
| 5,102,181 | 4/1992 | Pinkney | 312/7.1 X |
| 5,139,319 | 8/1992 | Miyai et al. | 312/7.1 |

*Primary Examiner*—Kenneth J. Dorner
*Assistant Examiner*—Nancy Mulcare
*Attorney, Agent, or Firm*—Leon Gilden

[57] ABSTRACT

A cabinet structure includes an enclosure to complementarily receive a motor vehicle radio unit and effect cooperation with a battery and speaker organization within the cabinet. The battery structure is arranged for ease of maintenance by positioning the battery upon a sliding tray relative to the housing to permit ease of disconnect and connect relative to the radio unit in servicing the battery.

2 Claims, 4 Drawing Sheets

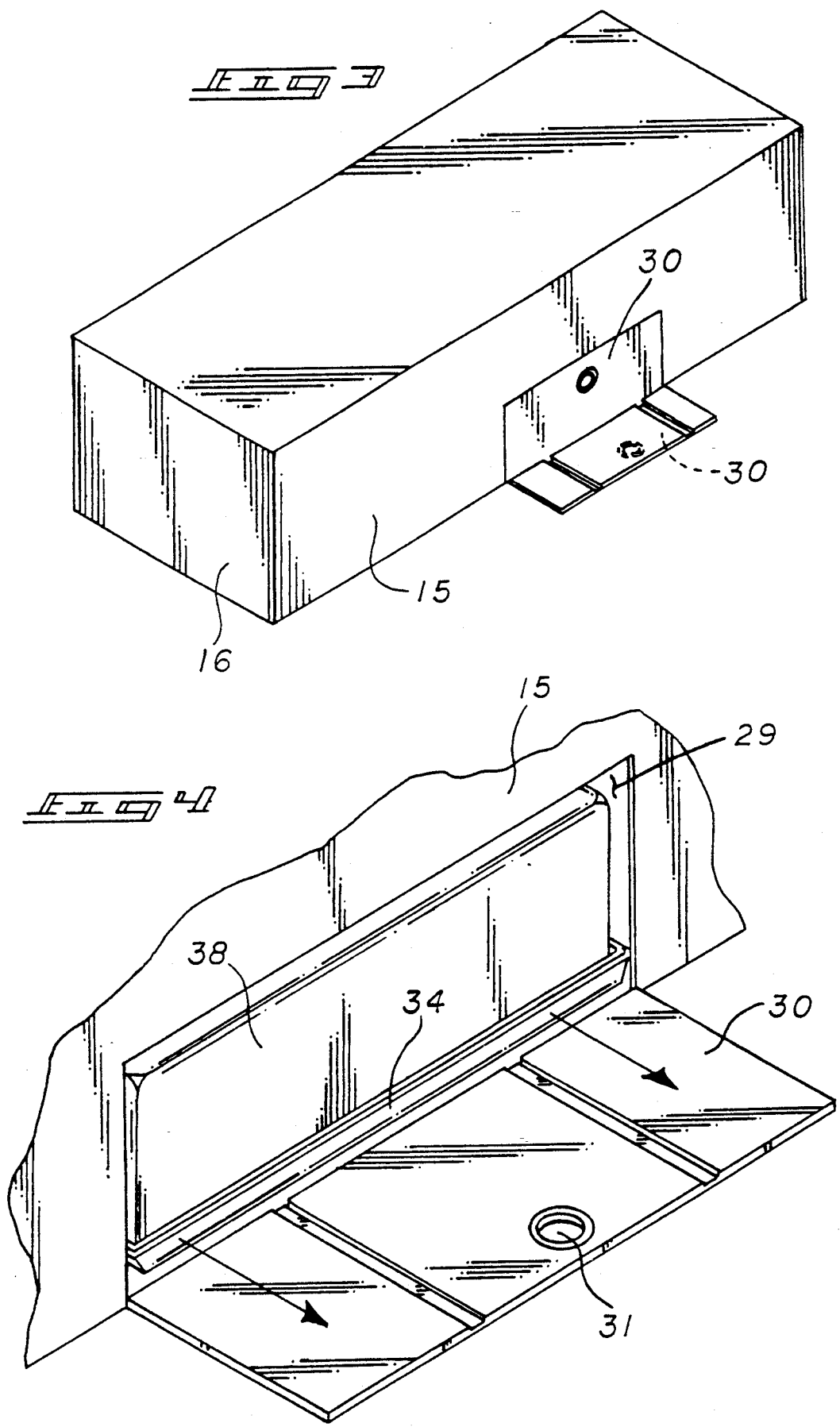

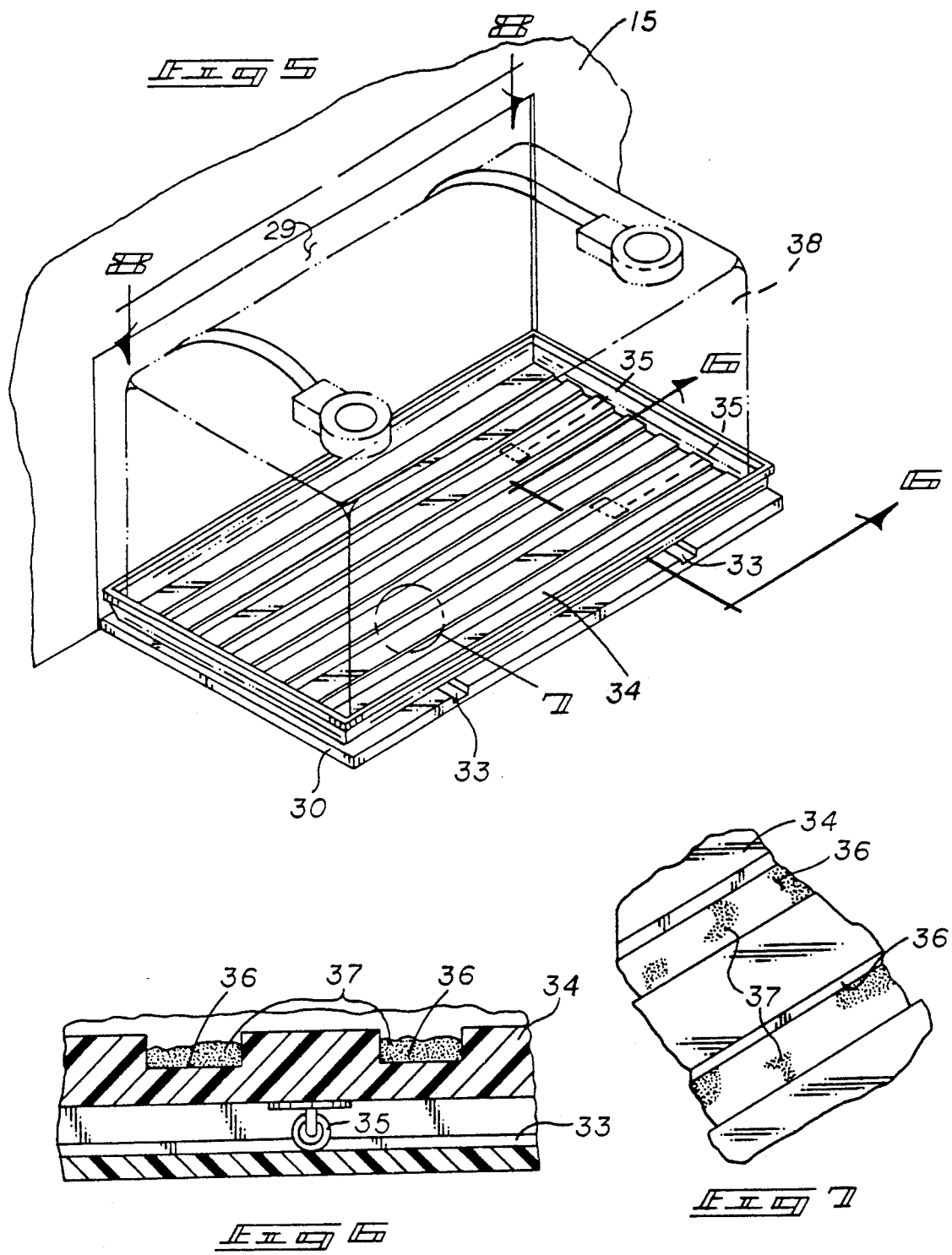

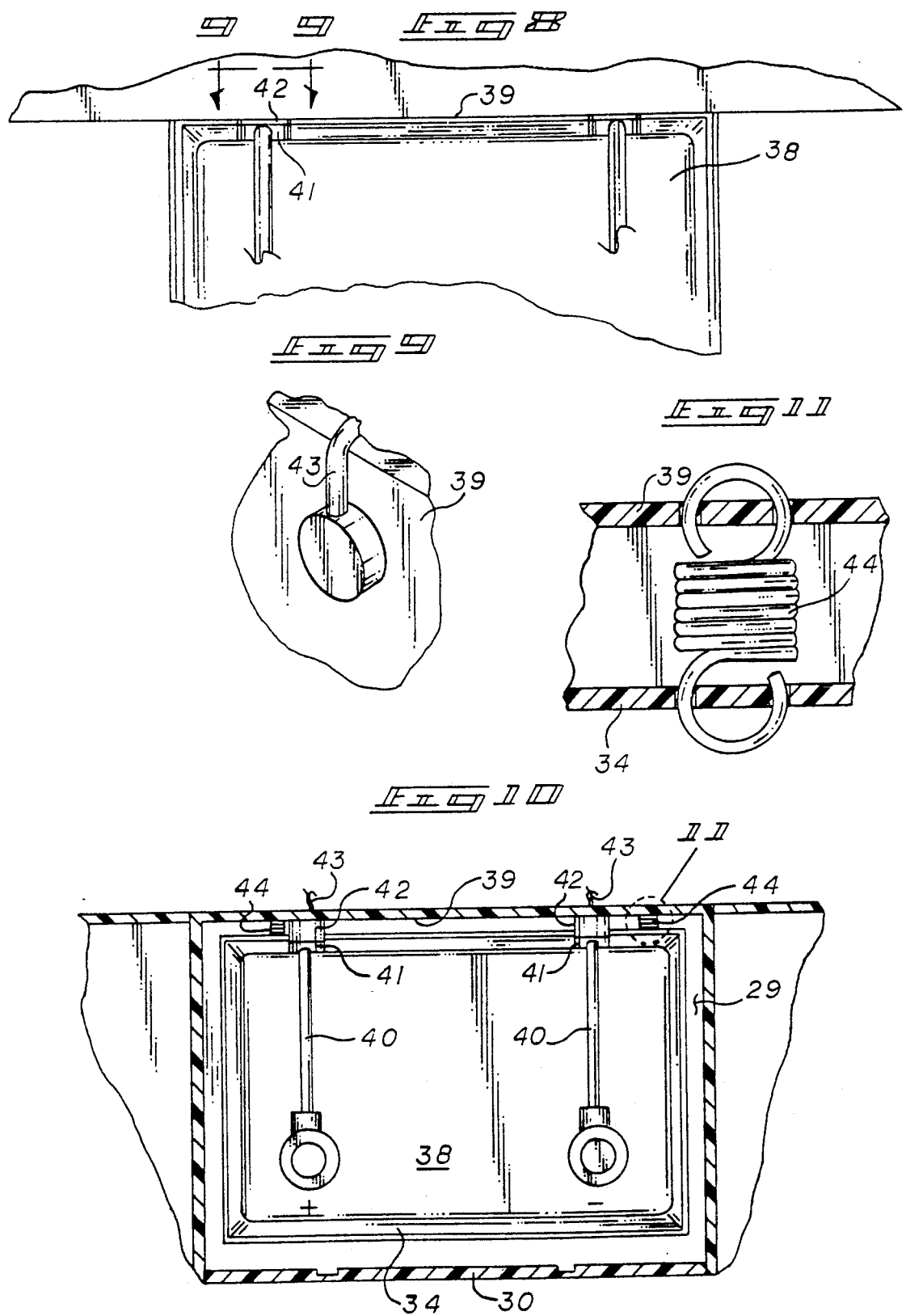

MOTOR VEHICLE RADIO RECEIVING CABINET

BACKGROUND OF THE INVENTION

1. Field of the Invention

The field of invention relates to radio receptacle structure, and more particularly pertains to a new and improved motor vehicle radio receiving cabinet arranged to provide for selective mounting of a motor vehicle radio with operative communication in a self-contained cabinet structure.

2. Description of the Prior Art

Motor vehicle radios due to cost and susceptibility to unauthorized tampering and the like are easily removable relative to motor vehicles, wherein the instant invention attempts to overcome deficiencies of the prior art by permitting the utilization of a motor vehicle radio within an enclosure to permit operative utilization of the radio with associated speakers and a battery permitting additional utilization of the radio within any desired environment separated from an associated motor vehicle and in this respect, the present invention substantially fulfills this need.

SUMMARY OF THE INVENTION

In view of the foregoing disadvantages inherent in the known types of motor vehicle radio structure now present in the prior art, the present invention provides a motor vehicle radio receiving cabinet wherein the same is arranged for permitting the operative utilization of a motor vehicle radio in a separated orientation relative to an associated motor vehicle. As such, the general purpose of the present invention, which will be described subsequently in greater detail, is to provide a new and improved motor vehicle radio receiving cabinet which has all the advantages of the prior art motor vehicle radio support structure and none of the disadvantages.

To attain this, the present invention provides a cabinet structure including an enclosure to complementarily receive a motor vehicle radio unit and effect cooperation with a battery and speaker organization within the cabinet. The battery structure is arranged for ease of maintenance by positioning the battery upon a sliding tray relative to the housing to permit ease of disconnect and connect relative to the radio unit in servicing the battery.

My invention resides not in any one of these features per se, but rather in the particular combination of all of them herein disclosed and claimed and it is distinguished from the prior art in this particular combination of all of its structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved motor vehicle radio receiving cabinet which has all the advantages of the prior art motor vehicle radio support structure and none of the disadvantages.

It is another object of the present invention to provide a new and improved motor vehicle radio receiving cabinet which may be easily and efficiently manufactured and marketed.

It is a further object of the present invention to provide a new and improved motor vehicle radio receiving cabinet which is of a durable and reliable construction.

An even further object of the present invention is to provide a new and improved motor vehicle radio receiving cabinet which is susceptible of a low cost of manufacture with regard to both materials and labor, and which accordingly is then susceptible of low prices of sale to the consuming public, thereby making such motor vehicle radio receiving cabinets economically available to the buying public.

Still yet another object of the present invention is to provide a new and improved motor vehicle radio receiving cabinet which provides in the apparatuses and methods of the prior art some of the advantages thereof, while simultaneously overcoming some of the disadvantages normally associated therewith.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 3 is an orthographic view, taken along the lines 3—3 of FIG. 1 in the direction indicated by the arrows.

FIG. 4 is an enlarged isometric illustration of the radio battery access door of the invention.

FIG. 5 is an isometric illustration in phantom illustrating the positioning of an associated battery upon a support tray.

FIG. 6 is an orthographic view, taken along the lines 6—6 of FIG. 5 in the direction indicated by the arrows.

FIG. 7 is an enlarged isometric illustration of section 7 as set forth in FIG. 5.

FIG. 8 is an orthographic view, taken along the lines 8—8 of FIG. 5 in the direction indicated by the arrows.

FIG. 9 is an orthographic view, taken along the lines 9—9 of FIG. 8 in the direction indicated by the arrows.

FIG. 10 is a top orthographic view of the battery tray structure.

FIG. 11 is an enlarged orthographic view of section 11 as set forth in FIG. 10.

DESCRIPTION OF THE PREFERRED EMBODIMENT

Figure 1:
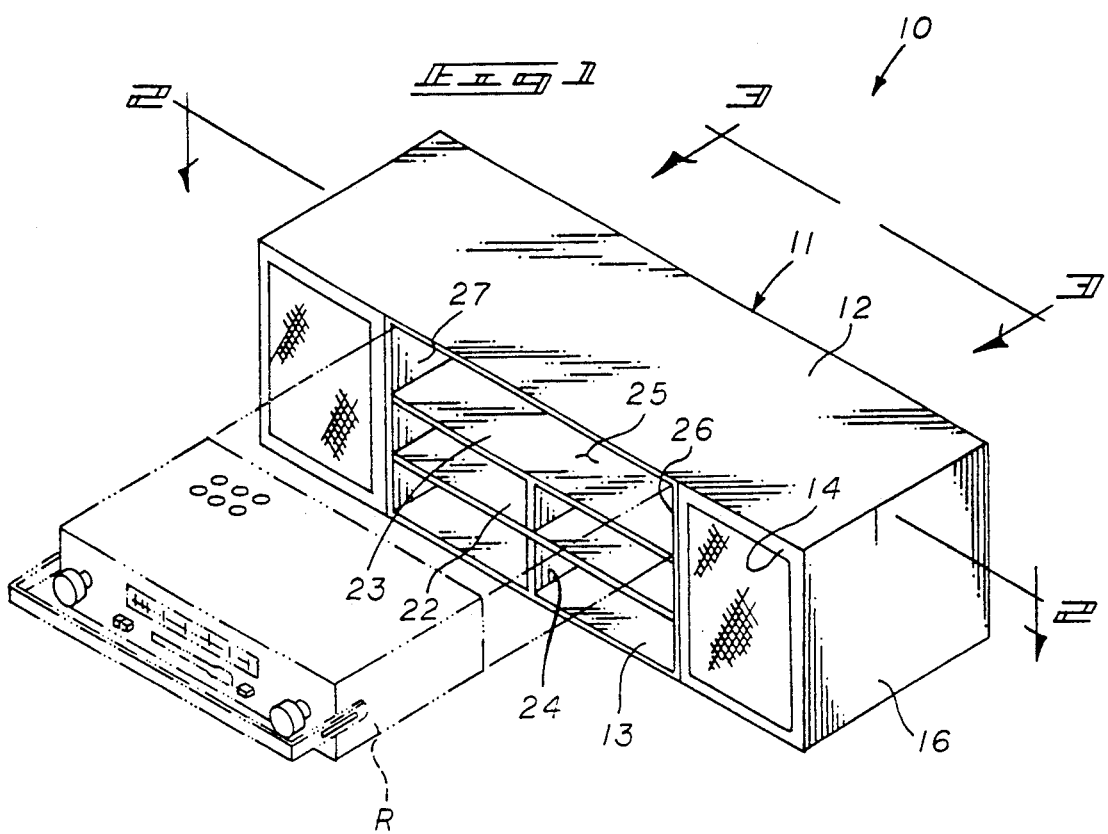
FIG. 1 is an isometric illustration of the instant invention.
Figure 2:
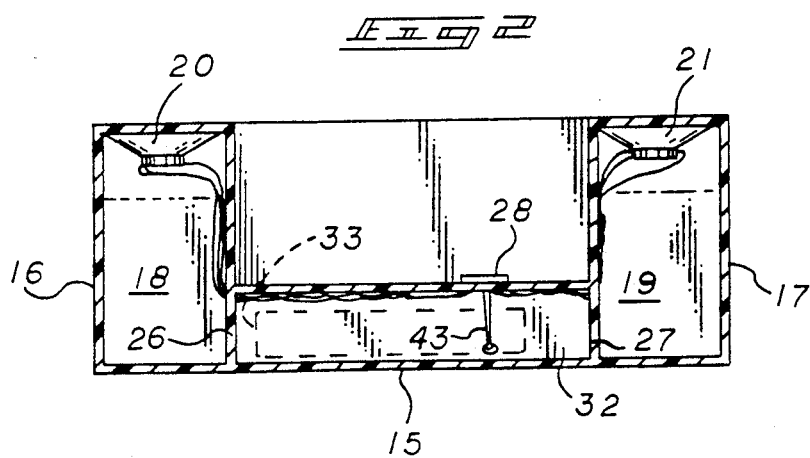
FIG. 2 is an orthographic view, taken along the lines 2—2 of FIG. 1 in the direction indicated by the arrows.

With reference now to the drawings, and in particular to FIGS. 1 to 11 thereof, a new and improved motor vehicle radio receiving cabinet embodying the principles and concepts of the present invention and generally designated by the reference numeral 10 will be described.

More specifically, the motor vehicle radio receiving cabinet 10 of the instant invention essentially comprises a housing 11 having a top wall 12 spaced from a floor 13 coextensive with the top wall. A front wall 14 is oriented parallel relative to a rear wall 15, with first and second side walls 16 and 17 oriented parallel relative to one another and orthogonally oriented between the front and rear walls. A first speaker cavity 18 is oriented within the cabinet in adjacency to the first side wall 16 and the second speaker cabinet oriented within the cabinet adjacent the side wall 17, with the respective first and second speaker cavities 18 and 19 oriented between the respective first and second side walls 16 and 17 and respective first and second interior walls 26 and 27 that extend orthogonally and coextensively relative to the first and second side walls. Respective first and second speakers 20 and 21 are mounted within first and second speaker cavities 18 and 19 and arranged in a contiguous communication with the front wall adjacent thereto utilizing conventional speaker grill cloth of various types as desired. An intermediate floor 22 is orthogonally oriented between the first and second interior walls 26 and 27 and positioned below and in coextensive relationship relative to an upper floor 23, that in turn is oriented parallel and below the top wall 12. Between the top wall 12 and the upper floor 23 is a radio receiving cavity 25, while a partition wall 24 extends coextensively and orthogonally between the upper floor 23 and the floor 13 to provide for storage for various cassettes and the like within the housing structure, as well as accessories associated with the radio "R". A battery cavity 29 is accessed through the housing rear wall 15 through a door 30, having a finger access opening 31. The door 30 is hingedly mounted to the housing floor 13 providing access to the battery cavity 29 upon pivoting the door in the orientation, as indicated in FIG. 4 for example. The door 30 includes a plurality of parallel door grooves 33 that are oriented orthogonally relative to the housing floor 13 when the door is in a first position coplanar with the housing rear wall, with the door grooves 33 oriented orthogonally relative to the housing rear wall 15 when the door 30 is in the second position. With the door in a second position as indicated in FIG. 4, a battery tray 34 is withdrawn from the battery cavity 29. To this end, the battery tray 34 includes a plurality of wheels 35, with a pair of such wheels 35 arranged and aligned within each of the door grooves 33 to permit ease of reciprocation and alignment of the battery relative to the battery cavity 29. The battery tray 34 further includes a plurality of battery tray cavities 36 having a neutralizing powder 37 (baking soda may be typically utilized) to minimize corrosion within the cabinet structure 10.

Reference to FIGS. 8-11 indicates a battery cavity interior wall 39 spaced from and parallel the housing rear wall 15 and positioned below the battery cavity roof plate 32. It should be noted that a radio plug connector 28 is mounted to the battery cavity interior wall 39 having radio electrical connector wires 43 directed from the plug 28 to associated interior wall plugs 42. The interior wall plugs 42 are cooperative with radio leg plugs 41, with each of the leg plugs having a battery terminal leg 40 directed from each leg plug 41 to an associated terminal of the battery 38. It should be noted that optionally at least one and desirably a plurality of battery tray return springs 44 are mounted between the battery tray 34 and the battery cavity internal wall 39 to bias the battery tray within the battery cavity 29 to permit ease of retraction of the tray within the cavity 29 and insure its electrical communication to the radio "R" by communication of the leg plug 41 to an associated interior wall plug 42. It should be further noted that for convenience, the plug connector 28 is arranged to mate with the radio "R" in any desired configuration of the myriad of configurations utilized by radio connectors to associate the speakers 20 and 21 with the radio "R" when the radio "R" is directed into the radio receiving cavity 25.

As to the manner of usage and operation of the instant invention, the same should be apparent from the above disclosure, and accordingly no further discussion relative to the manner of usage and operation of the instant invention shall be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by letters patent of the United States is as follows:

1. A motor vehicle radio receiving cabinet, comprising,
   a housing, the housing having a top wall and a floor, with the floor arranged in a parallel coextensive relationship relative to the top wall, and
   a rear wall extending between the top wall and the floor, and
   a front wall extending between the top wall and the floor spaced from the rear wall, and
   a first side wall extending between the front wall and the rear wall and a second side wall extending between the front wall and the rear wall, and a first interior wall arranged within the cabinet spaced from the first side wall coextensive with the first side wall, and a second interior wall mounted within the cabinet spaced from the second side wall coextensive with the second side wall, and a first speaker cavity oriented between the first side wall and the first interior wall, and a second speaker cavity oriented between the second side wall and the second interior wall, and a first speaker mounted within the first speaker cavity, and a second speaker mounted within the second speaker cavity, and an intermediate floor orthogonally directed between the first interior wall and the second interior wall spaced from and parallel the floor, and an upper floor oriented parallel to and between the intermediate floor and the top wall coextensive with the intermediate floor, and a radio receiving cavity defined between the first interior wall and the second interior wall and the upper floor and the top wall to receive a radio therewithin, and a battery cavity is oriented between the first interior wall and the second interior wall below the upper floor, with a battery cavity interior wall extending between the first interior wall and the second interior wall at an interface of the battery cavity and the radio receiving cavity, and the battery cavity interior wall including a radio plug connector, the radio plug connector including first and second speaker wire members directed through the respective first and second speaker wires, and a plug connector for electrical communication to the radio, and a battery cavity door directed through the rear wall hingedly mounted to the floor, and the door having a pair of parallel door grooves, wherein the door is oriented from a first position coplanar with the rear wall to a second position orthogonally oriented relative to the rear wall, and the grooves are orthogonally oriented relative to the floor in the first position and are orthogonally oriented relative to the rear wall in the second position, and a battery tray reciprocatably mounted within the battery cavity, with the battery tray having plural pairs of wheels, with one pair of wheels of said plural pair of wheels mounted within each of said grooves, and the battery tray including a plurality of battery tray cavities, and the battery tray cavities each having acidic neutralizing powder therewithin.

2. A cabinet as set forth in claim 1 including a battery mounted on the battery tray, with the battery having battery terminal legs, the battery including a first terminal and a second terminal, the first terminal and second terminal each includes a battery terminal leg, and each terminal leg includes a leg plug, and the battery cavity interior wall includes a plurality of interior wall plugs, and one of said interior wall plugs is arranged for alignment with one of said leg plugs, and at least one spring member is mounted between the battery tray and the battery cavity interior wall to bias the battery tray in adjacency to the battery cavity interior wall to effect electrical communication between each of the leg plugs with one of said interior wall plugs, and a radio electrical conduit is directed from each of the leg plugs and directed into electrical communication with the plug connector.

* * * * *